(12) United States Patent
Yamasaki et al.

(10) Patent No.: US 12,027,444 B2
(45) Date of Patent: Jul. 2, 2024

(54) ELECTRONIC DEVICE

(71) Applicant: LENOVO (SINGAPORE) PTE. LTD., Singapore (SG)

(72) Inventors: Seiji Yamasaki, Yokohama (JP); Masaaki Bandoh, Yokohama (JP); Shigeru Yuzawa, Yokohama (JP); Hua Wang, Beijing (CN)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 497 days.

(21) Appl. No.: 17/305,951

(22) Filed: Jul. 19, 2021

(65) Prior Publication Data

US 2022/0068761 A1 Mar. 3, 2022

(30) Foreign Application Priority Data

Sep. 3, 2020 (CN) .......................... 202010915036.8

(51) Int. Cl.
*H01L 23/40* (2006.01)
*G06F 1/20* (2006.01)
*H05K 1/18* (2006.01)

(52) U.S. Cl.
CPC .......... *H01L 23/4006* (2013.01); *G06F 1/203* (2013.01); *H05K 1/181* (2013.01); *H01L 2023/4087* (2013.01); *H05K 2201/10409* (2013.01); *H05K 2201/10598* (2013.01)

(58) Field of Classification Search
CPC ....... H01L 23/4006; G06F 1/183; G06F 1/20; G06F 1/203; G06F 1/1633; H05K 1/181; H05K 2201/10409
See application file for complete search history.

(56) References Cited

U.S. PATENT DOCUMENTS

| | | | | |
|---|---|---|---|---|
| 5,784,257 A | * | 7/1998 | Tata | .................... H01L 23/4006 257/713 |
| 7,206,207 B2 | * | 4/2007 | He | ...................... H01L 23/4006 361/825 |
| 2005/0103761 A1 | * | 5/2005 | Miki | ...................... H01R 13/03 219/121.69 |
| 2020/0037447 A1 | * | 1/2020 | Wang | ..................... H05K 1/144 |

FOREIGN PATENT DOCUMENTS

| | | |
|---|---|---|
| CN | 201252095 Y | 6/2009 |
| CN | 101593739 A | 12/2009 |
| CN | 210573482 U | 5/2020 |
| JP | 2003101272 A * | 4/2003 |

(Continued)

*Primary Examiner* — Walter H Swanson
*Assistant Examiner* — Jacob T Nelson
(74) *Attorney, Agent, or Firm* — SHIMOKAJI IP

(57) ABSTRACT

An electronic device includes: a circuit board having a mounting face, on which an electronic component is mounted; a heat receiver including a heat receiving plate opposed to the electronic component; and a fastening mechanism that fixes the heat receiver to the circuit board. The fastening mechanism includes a receiver having a proximal end and a distal end, the receiver having a mounting hole penetrating from the proximal end to the distal end; and a fastener that is inserted into the mounting hole for fastening to the receiver to press the heat receiver. The receiver is surface-mounted on the mounting face by soldering with the proximal end facing the mounting face.

5 Claims, 8 Drawing Sheets

(56) References Cited

FOREIGN PATENT DOCUMENTS

| | | | | |
|---|---|---|---|---|
| JP | 2003101272 | A | | 4/2003 |
| JP | 2009111171 | A | * | 5/2009 |
| JP | 2009111171 | A | | 5/2009 |
| JP | 2010055310 | A | | 3/2010 |
| JP | 2016197684 | A | * | 11/2016 ........... B62D 5/0406 |

* cited by examiner

ELECTRONIC DEVICE

FIELD OF THE INVENTION

The present invention relates to electronic devices.

BACKGROUND OF THE INVENTION

Electronic devices such as laptop personal computers may be equipped with a heat dissipation mechanism that dissipates heat generated from electronic components such as a CPU.

In one example, the heat dissipation mechanism includes a heat receiver that receives heat transmitted from the electronic components, a heat pipe, and a heat dissipator. The heat pipe sends the heat at the heat receiver to the heat dissipator such as cooling fins. The heat receiver is fixed to the circuit board by a fastening mechanism. The fastening mechanism includes a receiver and a fastener for fastening with the receiver. In one example, the receiver is placed in a through hole of the circuit board.

[Patent Document 1] Japanese Unexamined Patent Application Publication No. 2010-055310

SUMMARY OF THE INVENTION

In such an electronic device, wiring is formed on the circuit board, and a part of the wiring connected to electronic components such as the CPU may need to be patterned to avoid the through holes to place the receivers. This restricts the arrangement of the wiring, which can be disadvantageous in terms of design flexibility.

The present invention aims to provide an electronic device having less restrictions on the arrangement of wiring on the circuit board.

An electronic device according to a first aspect of the present invention includes: a circuit board having a mounting face, on which an electronic component is mounted; a heat receiver including a heat receiving plate opposed to the electronic component; and a fastening mechanism that fixes the heat receiver to the circuit board. The fastening mechanism includes a receiver having a proximal end and a distal end, the receiver having a mounting hole penetrating from the proximal end to the distal end; and a fastener that is inserted into the mounting hole for fastening to the receiver to press the heat receiver. The receiver is surface-mounted on the mounting face by soldering with the proximal end facing the mounting face.

Preferably in the electronic device, the mounting hole has an internal thread thereon, to which the fastener is screwed, and the internal thread extends over an entire length of the mounting hole.

Preferably in the electronic device, the receiver has an outer peripheral surface, the outer peripheral surface has unevenness at least at a part close to the proximal end.

Preferably in the electronic device, the receiver includes an outer peripheral metal layer on the outer peripheral surface of the receiver at least at a part close to the proximal end, the outer peripheral metal layer having a surface with higher solder wettability than the receiver has.

Preferably in the electronic device, the receiver includes an inner peripheral metal layer on the inner peripheral surface of the mounting hole at least at a part close to the proximal end, the inner peripheral metal layer having a surface with lower solder wettability than the receiver has.

The above-described aspects of present invention provide an electronic device having less restrictions on the arrangement of wiring on the circuit board.

DETAILED DESCRIPTION OF THE INVENTION

Figure 1:
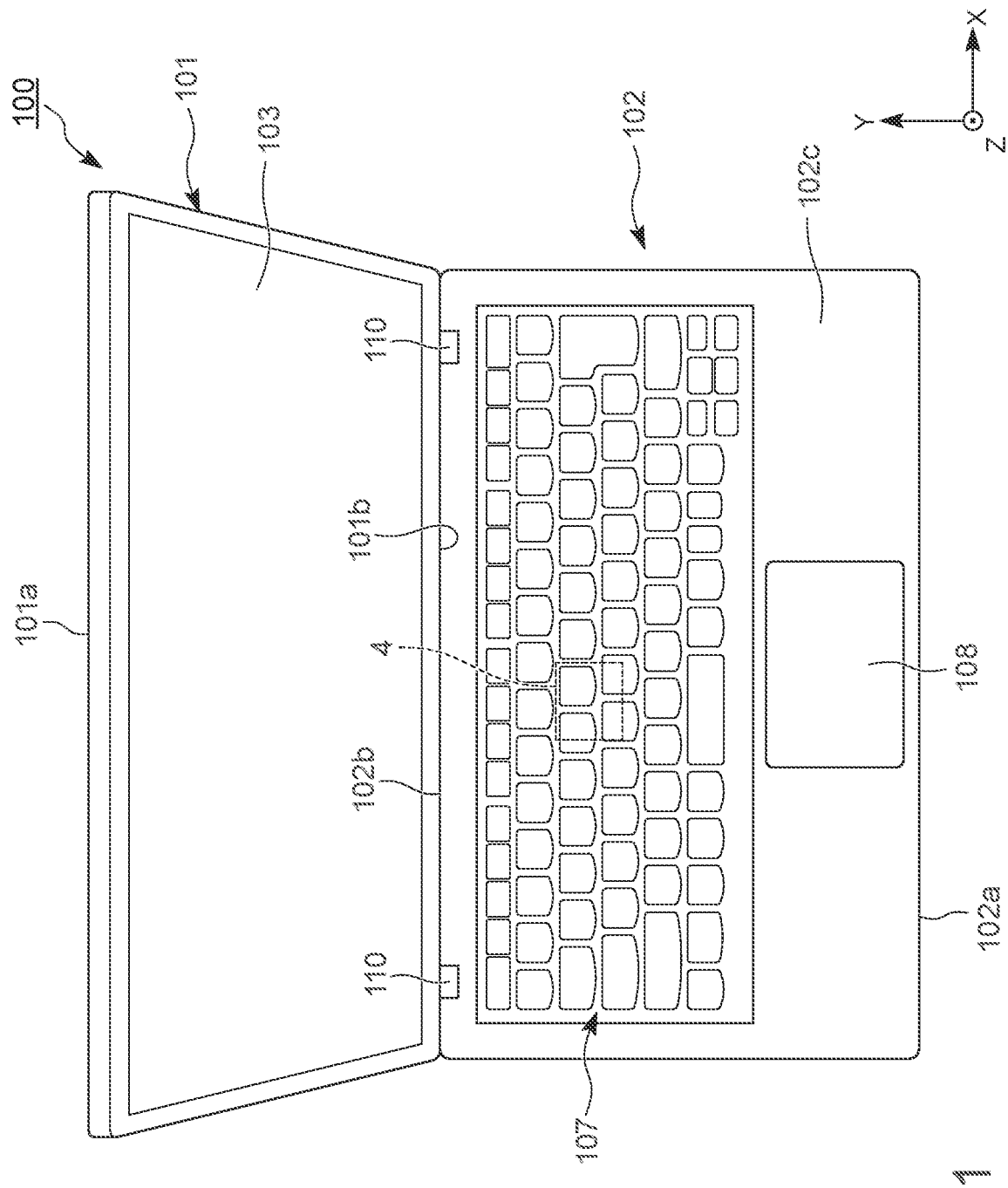
FIG. 1 is a plan view of an electronic device according to one embodiment.
Figure 2:
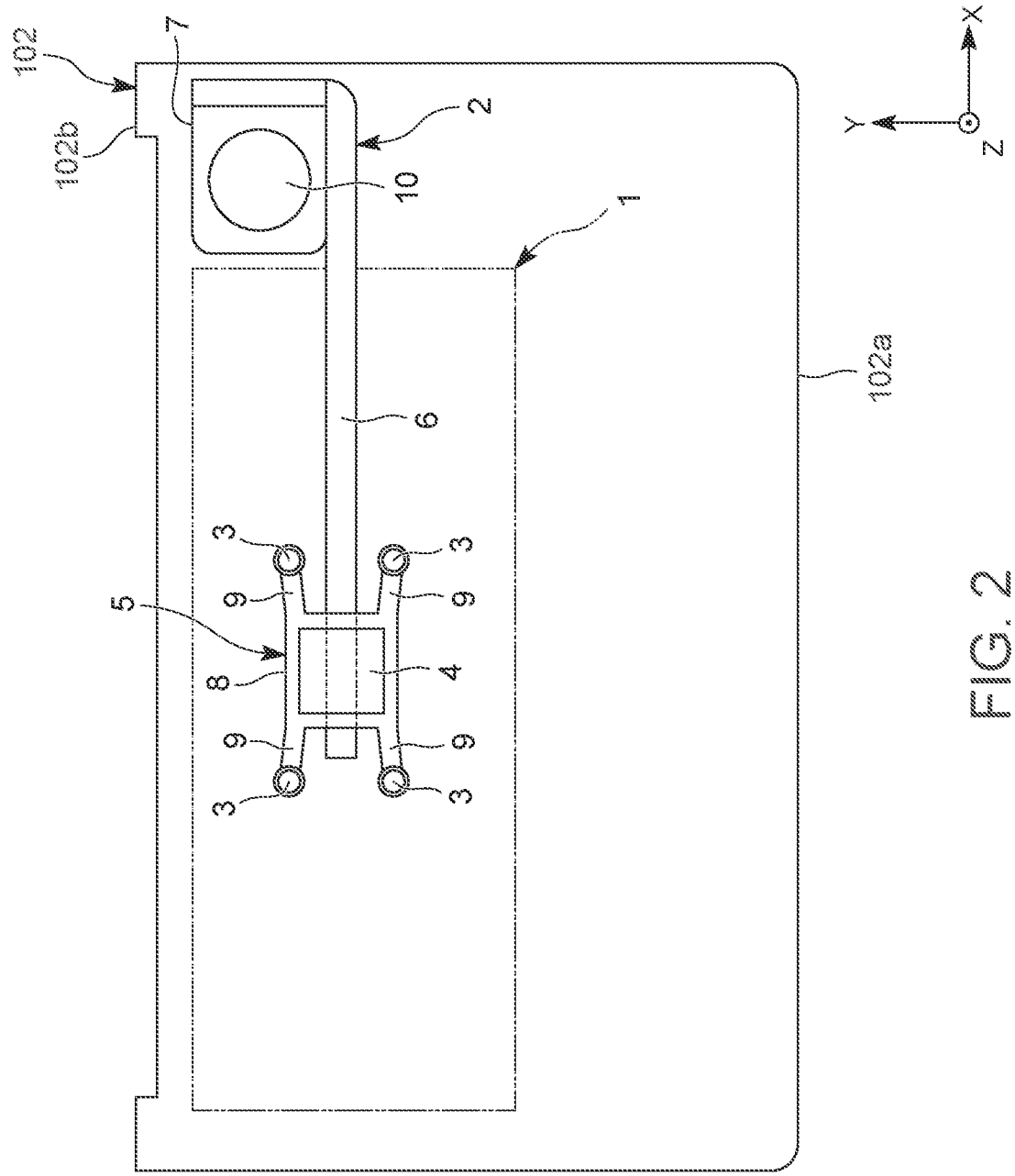
FIG. 2 is a schematic plan view of the internal structure of a second chassis in the electronic device according to one embodiment.

The following describes an electronic device according to one embodiment. FIG. 1 is a plan view of an electronic device 100 according to one embodiment. FIG. 2 is a schematic plan view of the internal structure of a second chassis 102 of the electronic device 100. FIG. 2 is a top plan view of the internal structure of the second chassis 102 with a keyboard 107 and a top plate of the second chassis 102 removed.

As illustrated in FIG. 1, the electronic device 100 includes a first chassis 101, the second chassis 102, a circuit board 1 (see FIG. 2), a heat dissipation mechanism 2 (see FIG. 2), and one or more fastening mechanisms 3 (see FIG. 2). In one example, the electronic device 100 is a laptop personal computer (PC).

The first chassis 101 is also referred to as a display chassis. The first chassis 101 houses a display 103. For example, the display 103 is a liquid crystal display or an organic electro-luminescence (EL) display. One end of the first chassis 101 is referred to as a first base end 101b. The end opposite to the first base end 101b is referred to as a first open end 101a.

The second chassis 102 is also referred to as a system chassis. The second chassis 102 has an inner face 102c, on which the keyboard 107 and a touch pad 108 are placed. The inner face 102c faces the display 103 when the first chassis 101 is closed to the second chassis 102. The second chassis 102 also houses other devices, such as a battery and storage devices. The storage devices include a solid state drive (SSD) and a hard disk drive (HDD).

One end of the second chassis 102 is referred to as a second base end 102b. The end opposite to the second base end 102b is referred to as a second open end 102a.

The second base end 102b of the second chassis 102 is connected to the first base end 101b of the first chassis 101 via a hinge mechanism 110.

The following may describe the positional relationship of the components in the second chassis 102 using the XYZ orthogonal coordinate system. Y direction is the front-rear direction. +Y direction is rearward. −Y direction is forward. Specifically, −Y direction is the direction from the second base end 102b to the second open end 102a. X direction is orthogonal to Y direction in the plane along the inner face 102c. In FIG. 1, X direction is the left-right direction. +X direction is to the right. −X direction is to the left. X direction is orthogonal to Y direction. Z-direction is a thickness direction of the second chassis 102. Z direction is orthogonal to X and Y directions. When the second chassis 102 is placed on a horizontal plane with the inner face 102c facing upward, Z direction is the top-bottom direction. +Z direction is upward. −Z direction is downward. Viewing in Z direction is called a plan view.

As illustrated in FIG. 2, the circuit board 1, the heat dissipation mechanism 2, and the fastening mechanism 3 are housed in the second chassis 102. In one example, the circuit board 1 is a printed circuit board (PCB). The circuit board 1 has a substantially rectangular shape.

The circuit board 1 has a mounting face 1a (see FIG. 4) on one side, on which a central processing unit (CPU) 4 is mounted. Hereinafter, the central processing unit is called a "CPU". The CPU 4 is a processor that executes application programs and performs general processing. The CPU 4 has a first principal surface 4a (see FIG. 4) that is a heat transfer area transferring heat to a heat receiving plate 8. The first principal surface 4a is rectangular in a plan view (see FIG. 3).

The CPU 4 is an example of "electronic components". Other examples of the electronic components include a graphics processing unit (GPU), a memory, and a communication module.

The heat dissipation mechanism 2 (cooling mechanism) includes a heat receiver 5, a heat pipe (heat transport member) 6 and a heat dissipation unit 7.

The heat receiver 5 includes the heat receiving plate 8 and a plurality of (four in this embodiment) legs 9.

The heat receiving plate 8 is made of a material having high thermal conductivity, which can be metals such as copper and aluminum. The heat receiving plate 8 is capable of transferring heat to the heat pipe 6. In other words, the heat receiving plate 8 is thermally coupled to the heat pipe 6. Preferably the heat receiving plate 8 is in contact with the heat pipe 6.

Figure 3:
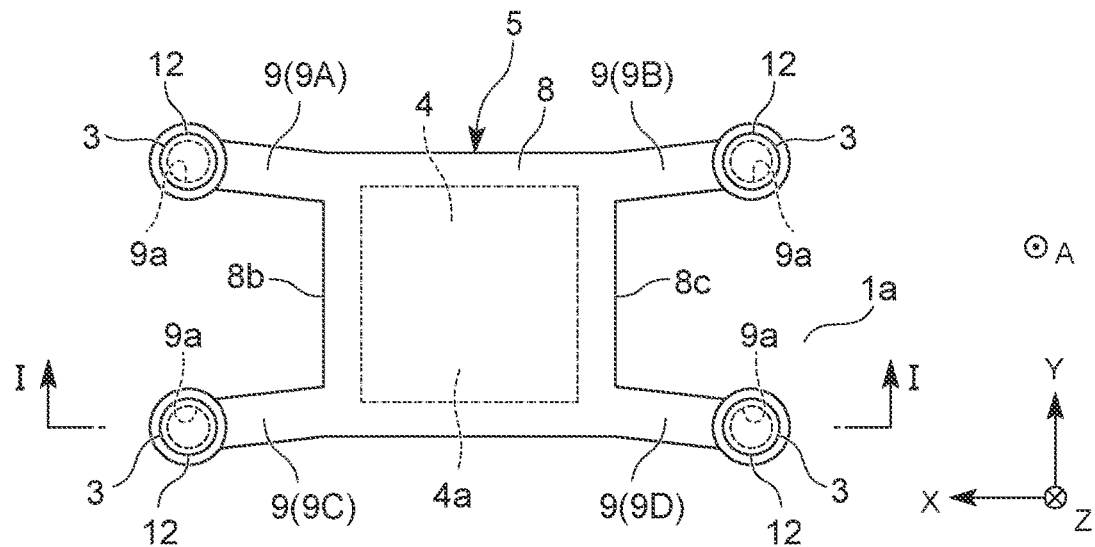
FIG. 3 is a plan view of a heat receiver.
Figure 4:
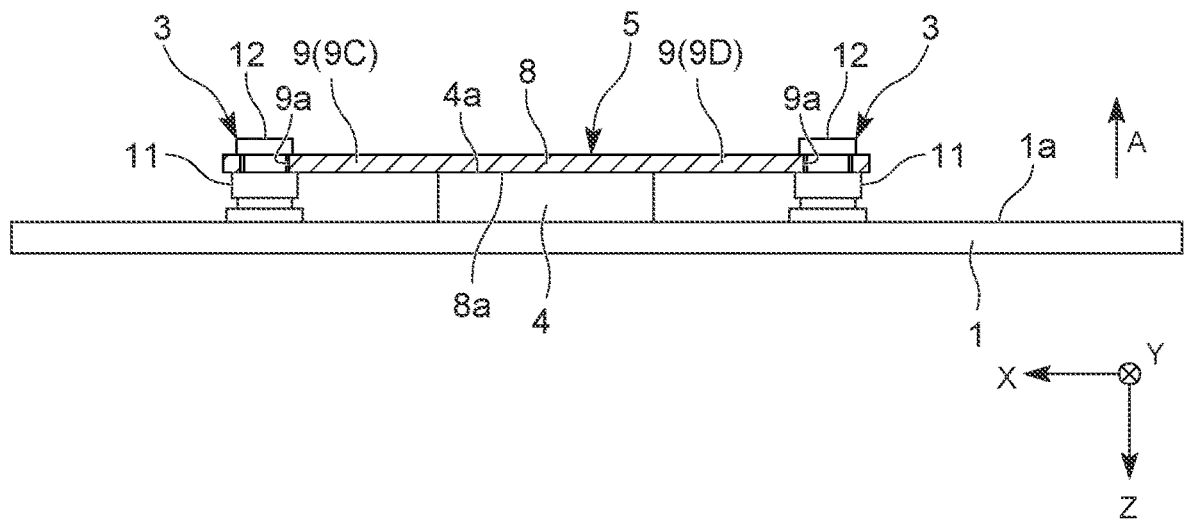
FIG. 4 is a side view in partial cross-section of the heat receiver and a circuit board.

FIG. 3 is a plan view of the heat receiver 5. FIG. 3 is a plan view of the heat receiver 5 viewed from the below. FIG. 4 is a side view in partial cross-section of the heat receiver 5 and the circuit board 1. FIG. 4 illustrates the heat receiver 5 in cross section taken along the line I-I in FIG. 3.

As illustrated in FIG. 3, the heat receiving plate 8 is rectangular in a plan view. The heat receiving plate 8 covers the first principal surface 4a of the CPU 4 in a plan view.

As illustrated in FIG. 4, the heat receiving plate 8 is opposed to the CPU 4. Specifically, one face (heat receiving surface 8a) of the heat receiving plate 8 is opposed to the first principal surface 4a of the CPU 4. This allows the heat receiving plate 8 to receive the heat from the CPU 4. In other words, the heat receiving plate 8 is thermally coupled to the CPU 4. Preferably the heat receiving plate 8a is in plane contact with the first principal surface 4a. Grease may be filled between the heat receiving plate 8 and the first principal surface 4a.

As illustrated in FIG. 3, the legs 9 extend outward from four corners of the heat receiving plate 8 in a plan view. The legs 9 extend in the direction away from the center of the heat receiving plate 8. The four legs 9 include a first leg 9A, a second leg 9B, a third leg 9C, and a fourth leg 9D.

The first leg 9A extends slightly obliquely backward (+Y direction) toward +X direction from the portion of the heat receiving plate 8 having the rear end of one side edge 8b. The second leg 9B extends slightly obliquely backward toward −X direction from the portion of the heat receiving plate 8 having the rear end of the other side edge 8c. The third leg 9C extends slightly obliquely forward (−Y direction) toward +X direction from the portion of the heat receiving plate 8 having the front end of the one side edge 8b. The fourth leg 9D extends slightly obliquely forward toward −X direction from the portion of the heat receiving plate 8 having the front end of the other side edge 8c.

The legs 9 are like plates. In one example, the legs 9 are made of metal. Preferably, the legs 9 have bending elasticity. The legs 9 having bending elasticity allow the heat receiving plate 8 to be pressed against the CPU 4 by the elasticity of the legs 9. This can enhance the heat transfer efficiency between the heat receiving plate 8 and the CPU 4.

As illustrated in FIG. 4, each leg 9 has an insertion hole 9a at the distal end. The insertion hole 9a penetrates the leg 9 in the thickness direction.

As illustrated in FIG. 2, the heat pipe 6 has a tubular body having an enclosed space inside. In one example, the heat pipe 6 is made of metal such as copper or aluminum. The enclosed space inside the heat pipe 6 is filled with working fluid that is flowable. The heat pipe 6 is connected to the heat dissipation unit 7 in a heat transferable manner.

In one example, the heat dissipation unit 7 includes cooling fins (not illustrated) and a heat radiating fan 10. The cooling fins are connected to the heat pipe 6 in a heat transferable manner. The heat radiating fan 10 cools the cooling fins by blowing air.

The heat dissipation mechanism 2 transmits the heat generated at the CPU 4 to the heat dissipation unit 7 via the heat receiving plate 8 and the heat pipe 6. The heat dissipation unit 7 discharges the heat transferred via the heat pipe 6 out of the second chassis 102.

As illustrated in FIG. 4, the fastening mechanism 3 includes a receiver 11 and a fastener 12. The fastening mechanism 3 fixes the leg 9 of the heat receiver 5 to the circuit board 1.

Figure 5:
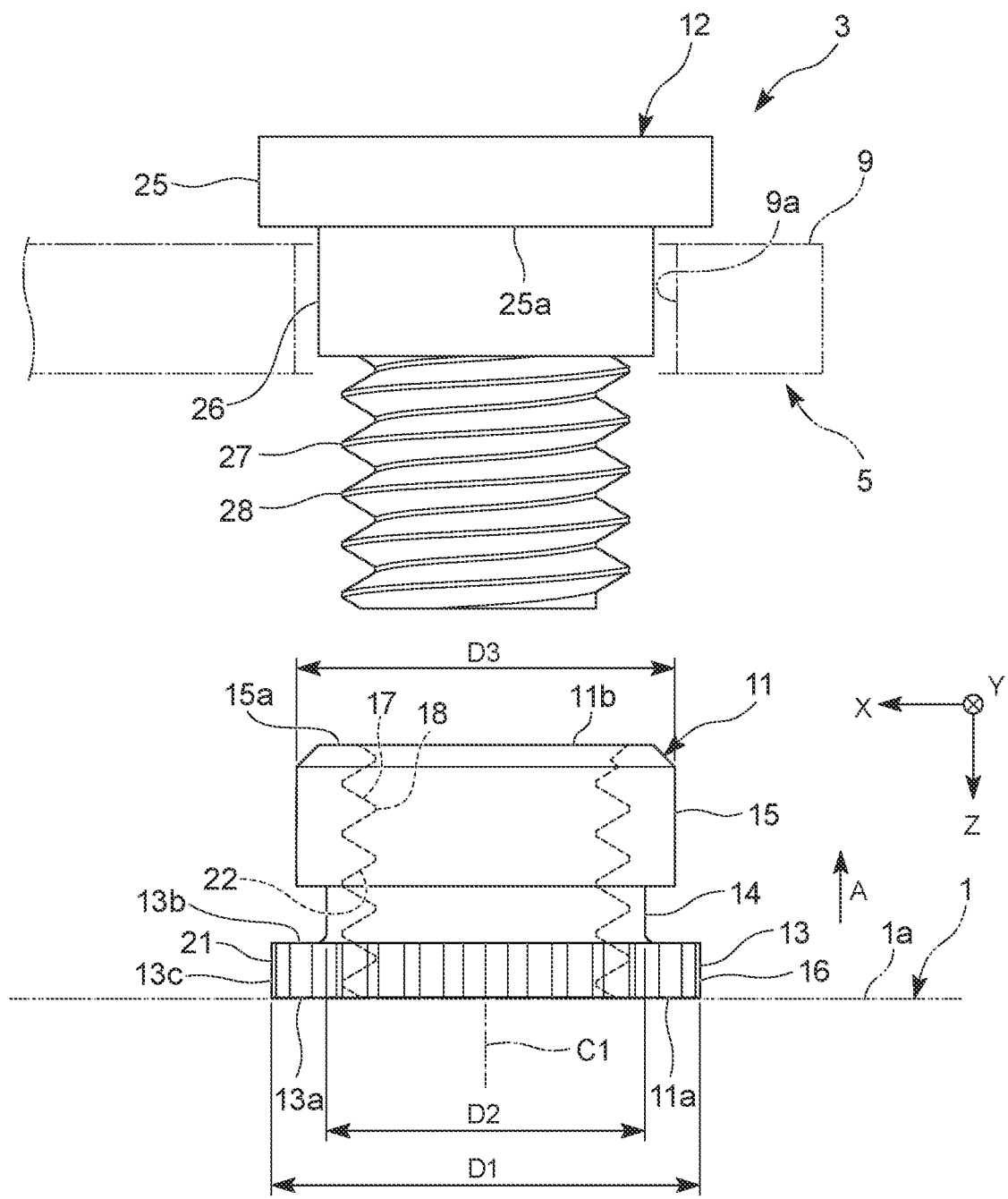
FIG. 5 is a side view of a receiver and a fastener.
Figure 6:
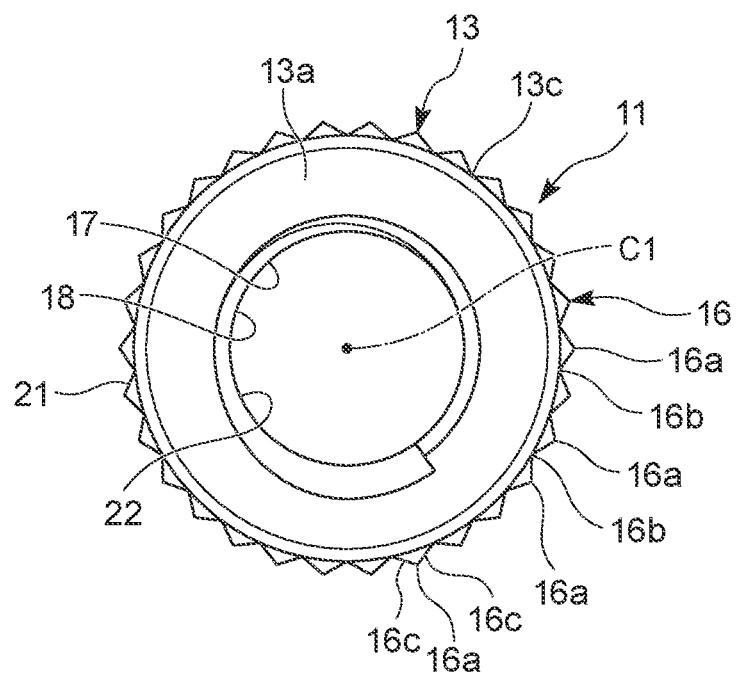
FIG. 6 is a plan view of a receiver viewed from the proximal end.
Figure 7:
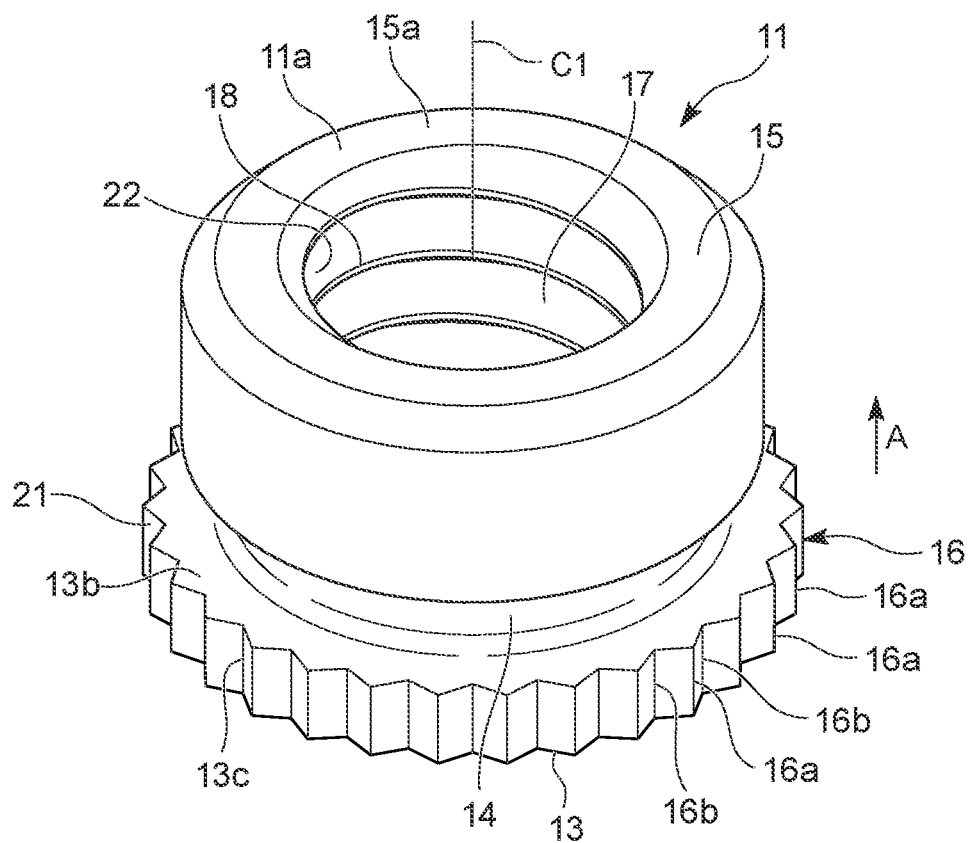
FIG. 7 is a perspective view of a receiver.
Figure 8:
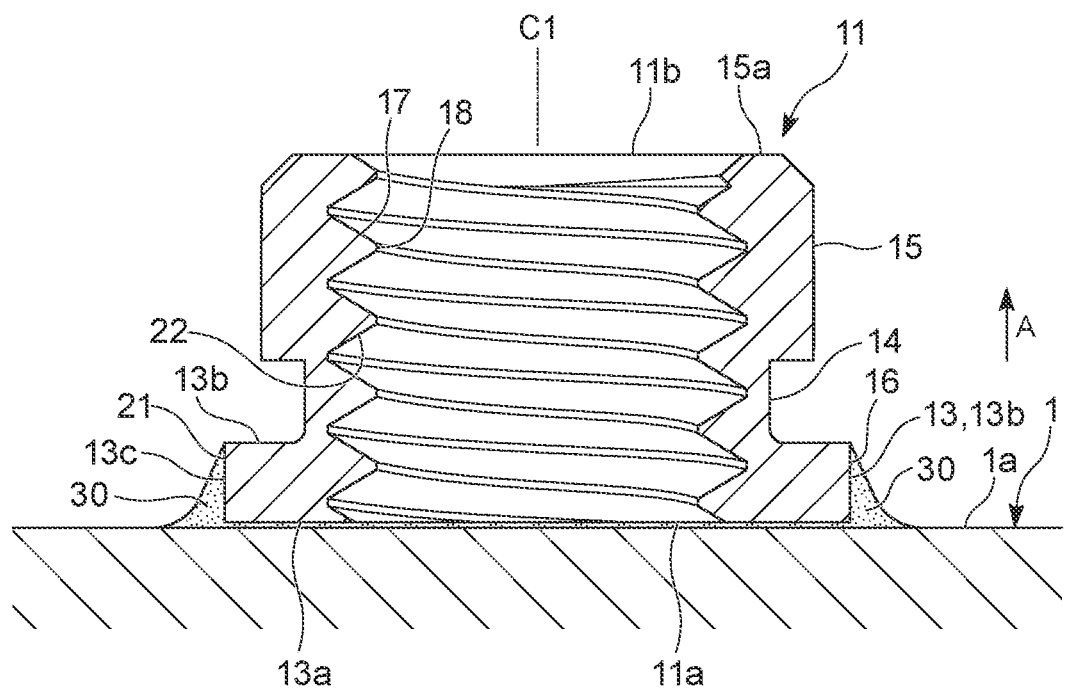
FIG. 8 is a cross-sectional view of a soldered receiver.
Figure 9:
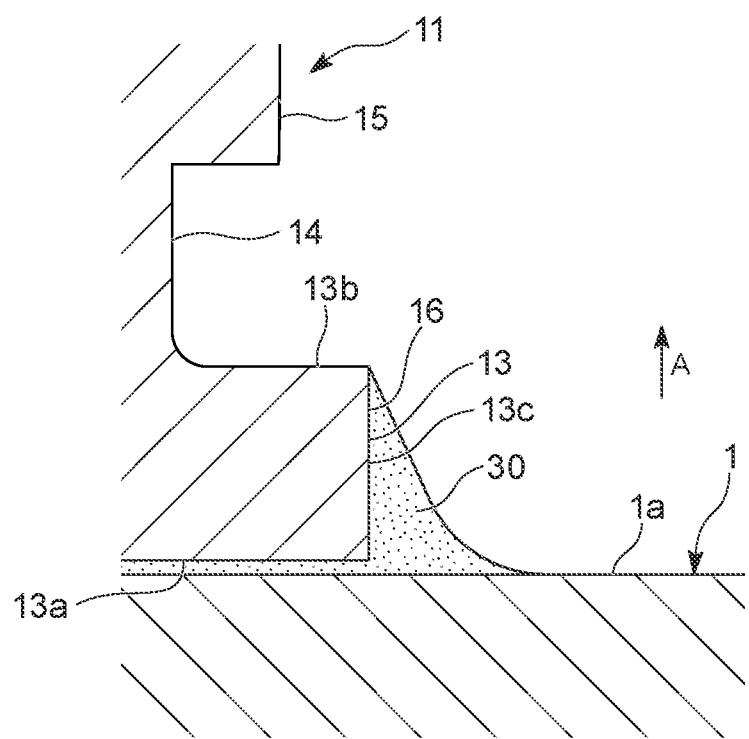
FIG. 9 is an enlarged cross-sectional view of the soldered receiver.

FIG. 5 is a side view of the receiver 11 and the fastener 12. FIG. 6 is a plan view of the receiver 11 viewed from a proximal end 11a. FIG. 7 is a perspective view of the receiver 11. FIG. 8 is a cross-sectional view of the soldered receiver 11. FIG. 9 is an enlarged cross-sectional view of the soldered receiver 11.

As illustrated in FIG. 5, the receiver 11 includes a base 13, a neck 14, and a head 15. C1 denotes the central axis of the receiver 11. The direction along the central axis C1 is called the "axial direction". The direction around the central axis C1 is called the "circumferential direction". One end of the receiver 11 in the axial direction is called the proximal end 11a. The other end of the receiver 11 in the axial direction is called a distal end 11b. The distal end 11b and the proximal end 11a are the axially opposite ends.

The base 13 has a substantially disc or cylindrical shape having the central axis C1. Reference numeral 13a denotes one end face (first end face) of the base 13 in the axial direction, and this is an attachment face to be attached to the mounting face 1a of the circuit board 1. The attachment face 13a is the end face located at the proximal end 11a of the receiver 11. Reference numeral 13b denotes the other end face (second end face) of the base 13 in the axial direction. The direction from the attachment face 13a to the second end face 13b along the central axis C1 is called a "main direction A". The main direction A is directed from the proximal end 11a to the distal end 11b of the receiver 11.

As illustrated in FIGS. 6 and 7, the base 13 has an outer peripheral surface 13c, on which knurls 16 including a plurality of protruding portions 16a are formed. The knurls 16 include unevenness (including at least one of recessed portions and protruding portions) formed on the outer peripheral surface 13c. The knurls 16 are formed on the entire area of the outer peripheral surface 13c of the base 13. In this embodiment, the knurls 16 are formed only on the base 13. This means that the knurls 16 are formed in a partial area of the outer peripheral surface of the receiver 11, including the proximal end 11a.

Adhesion of the solder 30 (see FIGS. 8 and 9) to the outer peripheral surface of the receiver 11 proceeds from the proximal end 11a, so that the knurls 16 formed at least in the area including the proximal end 11a facilitate the spread of the solder 30 over a wide range of the outer peripheral surface of the receiver 11. This enhances the bonding strength of the solder 30 to the receiver 11.

The protruding portions 16a protrude outward in the radial direction from the outer peripheral surface of the base 13. Each protruding portion 16a is a protruding ridge extending in the axial direction, and has a uniform protruding height in the axial direction. Viewing in the direction parallel to the central axis C1, the protruding portions 16a each have an inverted V-shape (mountain shape) whose width narrows in the protruding direction. In one example, each protruding portion 16a has two flat outer side faces 16c and 16c that are inclined relative to the radial direction (see FIG. 6). These two outer side faces 16c and 16c of the protruding portion 16a get close to each other in the protruding direction of the protruding portion 16a. In one example, the protrusion height of the protruding portions 16a from the outer peripheral surface of the base 13 is 0.01 mm to 1 mm.

Viewing in the direction parallel to the central axis C1, the diameter of the circumscribed circle that connects the vertices of the plurality of protruding portions 16a is called the outer diameter D1 of the base 13 (see FIG. 5).

The plurality of protruding portions 16a are formed at different positions in the circumferential direction. The plurality of protruding portions 16a are arranged at a certain pitch in the circumferential direction over the entire circumference of the outer peripheral surface 13c. The plurality of protruding portions 16a are arranged side by side without intervals in the circumferential direction.

The adjacent protruding portions 16a and 16a in the circumferential direction define a recessed portion 16b therebetween. The recessed portion 16b is a groove extending in the axial direction, and has a uniform depth in the axial direction. Viewing in the direction parallel to the central axis C1, the recessed portion 16b may have a V-shape (valley shape) whose width narrows in the depth direction. The plurality of recessed portions 16b are arranged side by side without intervals in the circumferential direction.

It can be said that the knurls 16 are formed with these plurality of protruding portions 16a arranged in the circumferential direction or are formed with these plurality of recessed portions 16b arranged in the circumferential direction. It can be also said that the knurls 16 are formed with alternating protruding portions and recessed portions.

These protruding portions 16a and recessed portions 16b extending in the axial direction allow the solder 30 (see FIG. 8 and FIG. 9) to easily flow in the axial direction along the protruding portions 16a and the recessed portions 16b. This increases the adhesion height of the solder 30 (dimension of the adhesion area in the main direction A), and thus increases the adhesion area of the solder 30. This therefore enhances the bonding strength of the receiver 11 to the circuit board 1.

In this embodiment, the knurls 16 are formed only on the outer peripheral surface 13c of the base 13. The area of forming the knurls 16 is not limited to the outer peripheral surface 13c of the base 13. In another example, the knurls 16 may be formed not only on the base 13, but also on the outer peripheral surfaces of the neck 14 and the head 15. The knurls 16 may be formed on the entire area of the outer peripheral surface of the receiver 11, or may be formed on a partial area thereof. The knurls 16 may be formed on a partial area of the receiver 11 in the circumferential direction, instead of the entire circumference of the receiver 11.

In this embodiment, the knurls 16 are formed on the area of the outer peripheral surface including the proximal end 11a of the receiver 11, and the knurls may be formed on at least the "area close to the proximal end 11a" of the outer peripheral surface of the receiver 11. The "area close to the proximal end 11a" means the area reaching the proximal end 11a or the area proximate to the proximal end 11a.

For example, assume the case where the outer peripheral surface 13c of the base 13 has a narrow, smooth annular area including the proximal end 11a, and knurls are formed in the area excluding this annular area. Since the annular area is narrow, it can be said that the knurls are formed including the area proximate to the proximal end 11a. This case therefore corresponds to the knurls being formed on "at least the area close to the proximal end 11a."

FIG. 7 illustrates the case where the knurls 16 are formed on the entire area of the outer peripheral surface 13c of the base 13. In this case, it can be said that the knurls 16 are formed in the area reaching the proximal end 11a. This case therefore corresponds to the knurls 16 being formed on "at least the area close to the proximal end 11a."

As illustrated in FIG. 5, the neck 14 protrudes from the second end face 13b of the base 13 in the main direction A. Viewing in the direction parallel to the central axis C1, the neck 14 has a circular shape concentric with the base 13. The outer diameter D2 of the neck 14 is smaller than the outer diameter D1 of the base 13.

The head 15 is located in the main direction A relative to the neck 14. Viewing in the direction parallel to the central axis C1, the head 15 has a circular shape concentric with the base 13. The outer diameter D3 of the head 15 is larger than the outer diameter D2 of the neck 14. Reference numeral 15a denotes a distal end face of the head 15 in the main direction A.

The outer diameter of the head 15 is larger than the inner diameter of the insertion hole 9a of the heat receiver 5.

The receiver 11 has a mounting hole 17. The mounting hole 17 penetrates the receiver 11 in the axial direction from the proximal end 11a to the distal end 11b. Viewing in the direction parallel to the central axis C1, the mounting hole 17 has a circular shape concentric with the base 13, the neck 14, and the head 15.

On the inner circumference of the mounting hole 17, an internal thread 18 is formed. The internal thread 18 screws on an external thread 28 of a screw shaft 27 of the fastener 12 (see FIG. 5).

The internal thread 18 extends over the entire length of the mounting hole 17 (the entire length in the axial direction). This keeps a sufficient length of the effective internal thread 18 and thus increases the screwing strength of the fastener 12. This lowers the height of the receiver (dimension in the axial direction), i.e., enables a low-profile receiver 11. This is advantageous in making the electronic device 100 smaller and thinner.

Examples of the material of the receiver 11 include metals such as iron, iron alloy, stainless steel, and brass.

An outer peripheral metal layer 21 may be formed on the outer peripheral surface of the receiver 11. The outer peripheral metal layer 21 has the surface with higher solder wettability than the surface of the receiver 11. The solder wettability indicates an affinity with liquid solder. A surface with higher solder wettability means that liquid solder can be easily in a wetting state and spread on the surface. Solder wettability can be expressed by the contact angle of the solder on the surface. Higher wettability of solder means a smaller contact angle of the solder. Lower wettability of solder means a large contact angle of the solder. The contact angle of solder can be measured by a known method, such as a drop method, a suspension method, a plate method, or a Washburn method.

The outer peripheral metal layer 21 may be a metal layer containing tin (Sn), which enhances the solder wettability of the surface of the outer peripheral metal layer 21. The outer peripheral metal layer 21 can be formed by plating, sputtering, vapor deposition, or the like. Preferably the outer peripheral metal layer 21 is a plating layer.

Preferably the outer peripheral metal layer 21 is formed in the area including at least the proximal end 11a of the outer peripheral surface of the receiver 11. Although the area of forming the outer peripheral metal layer 21 may be a part of the outer peripheral surface of the receiver 11, the outer peripheral metal layer 21 is preferably formed on the entire area of the outer peripheral surface considering the manufacturability.

The outer peripheral metal layer 21 formed on the receiver 11 enhances the solder wettability, which means that the solder 30 can easily spread over a wide range of the outer peripheral surface of the receiver 11. This therefore enhances the bonding strength of the solder 30 to the receiver 11. This therefore fixes the receiver 11 to the circuit board 1 firmly.

Adhesion of the solder 30 (see FIGS. 8 and 9) to the outer peripheral surface of the receiver 11 proceeds from the proximal end 11a, and the outer peripheral metal layer formed in the area including the proximal end 11a facilitates the spread of the solder 30 over a wide range of the outer peripheral surface of the receiver 11. This therefore enhances the bonding strength of the solder 30 to the receiver 11.

The outer peripheral metal layer 21 may be formed at least on the "area close to the proximal end 11a" of the outer peripheral surface of the receiver 11. The "area close to the proximal end 11a" means the area reaching the proximal end 11a or the area proximate to the proximal end 11a.

For example, assume the case where the outer peripheral surface of the receiver 11 has a narrow annular area including the proximal end 11a, and the outer peripheral metal layer is not formed at this annular area. The outer peripheral metal layer is formed on the entire area of the outer peripheral surface of the receiver 11 excluding this annular area. In this case, since the annular area is narrow, it can be said that the outer peripheral metal layer is formed including the area proximate to the proximal end 11a. This case therefore corresponds to the outer peripheral metal layer being formed on "at least the area close to the proximal end 11a."

It can be said that when the outer peripheral metal layer 21 is formed on the entire area of the outer peripheral surface of the receiver 11, this outer peripheral metal layer 21 is formed in the area reaching the proximal end 11a. This case therefore corresponds to the outer peripheral metal layer 21 being formed on "at least the area close to the proximal end 11a."

An inner peripheral metal layer 22 may be formed on the inner peripheral surface of the mounting hole 17. The inner peripheral metal layer 22 has the surface with lower solder wettability than the surface of the receiver 11.

The inner peripheral metal layer 22 may be a metal layer containing nickel (Ni), which lowers the solder wettability of the surface of the inner peripheral metal layer 22. The inner peripheral metal layer 22 can be formed by plating, sputtering, vapor deposition, or the like. Preferably the inner peripheral metal layer 22 is a plating layer.

Preferably the inner peripheral metal layer 22 is formed in the area of the inner peripheral surface of the mounting hole 17 including the proximal end 11a. Adhesion of the solder 30 to the inner peripheral surface of the mounting hole 17 proceeds from the proximal end 11a, and the inner peripheral metal layer 22 formed in the area of the inner peripheral surface of the mounting hole 17 including the proximal end 11a enhances the effect of preventing adhesion of the solder 30 to the inner peripheral surface of the mounting hole 17. Although the area of forming the inner peripheral metal layer 22 may be a part of the inner peripheral surface of the mounting hole 17, the inner peripheral metal layer 22 is preferably formed on the entire area of the inner peripheral surface of the mounting hole 17 considering the manufacturability.

The inner peripheral metal layer 22 formed on the receiver 11 suppresses adhesion of the solder 30 to the inner peripheral surface of the mounting hole 17, and this avoids a change in the shape of the recessed portions of the internal thread 18 due to the solder 30. This keeps a sufficient length of the effective internal thread 18 and thus suppresses deterioration of the screwing strength of the fastener 12. Such a sufficient length of the effective internal thread 18 lowers the height of the receiver 11 (dimension in the axial direction), i.e., enables a low-profile receiver 11. A low-profile receiver 11 is advantageous in making the electronic device 100 smaller and thinner.

In one example, the outer peripheral metal layer 21 and the inner peripheral metal layer 22 can be formed on the receiver 11 by forming a metal layer to be the outer peripheral metal layer 21 on the entire surface of the receiver 11, and then forming the inner peripheral metal layer 22 on the metal layer only on the inner peripheral surface of the mounting hole 17. In another example, the outer peripheral metal layer 21 and the inner peripheral metal layer 22 can be formed by forming a metal layer to be the inner peripheral metal layer 22 on the entire surface of the receiver 11, and then forming the outer peripheral metal layer 21 on the metal layer only on the outer peripheral surface of the receiver 11.

The inner peripheral metal layer 22 may be formed at least on the "area close to the proximal end 11a" of the inner peripheral surface of the mounting hole 17. The "area close to the proximal end 11a" means the area reaching the proximal end 11a or the area proximate to the proximal end 11a.

For example, assume the case where the inner peripheral surface of the mounting hole 17 has a narrow annular area including the proximal end 11a, and the inner peripheral metal layer is not formed in this annular area. The inner peripheral metal layer is formed on the entire area of the inner peripheral surface of the mounting hole 17 excluding this annular area. Since the annular area is narrow, it can be said that the inner peripheral metal layer is formed including the area proximate to the proximal end 11a. This case therefore corresponds to the inner peripheral metal layer being formed on "at least the area close to the proximal end 11a."

It can be said that when the inner peripheral metal layer 22 is formed on the entire area of the inner peripheral surface of the mounting hole 17, this inner peripheral metal layer 22 is formed in the area reaching the proximal end 11a. This case therefore corresponds to the inner peripheral metal layer 22 being formed on "at least the area close to the proximal end 11a."

The fastener 12 includes a head 25, an intermediate extension 26, and the screw shaft 27.

The outer diameter of the head 25 is larger than the inner diameter of the insertion hole 9a of the heat receiver 5.

The intermediate extension 26 protrudes from one face 25a (lower surface in FIG. 5) of the head 25. The intermediate extension 26 has a substantially cylindrical shape concentric with the head 25. The outer diameter of the intermediate extension 26 is smaller than the outer diameter of the head 25. The outer diameter of the intermediate extension 26 is smaller than the inner diameter of the insertion hole 9a of the heat receiver 5, so that the intermediate extension 26 is insertable into the insertion hole 9a.

The screw shaft 27 protrudes from the distal end (lower end in FIG. 5) of the intermediate extension 26 in the distal end direction (downward in FIG. 5). The screw shaft 27 is insertable into the mounting hole 17 of the receiver 11. On the outer peripheral surface of the screw shaft 27, the external thread 28 is formed, which screws on the internal thread 18 of the receiver 11.

The fastener 12 can be screwed for fastening to the receiver 11 by inserting the screw shaft 27 into the mounting hole 17 of the receiver 11 and screwing it into the internal thread 18. This allows the head 25 to press the legs 9 (see FIG. 4) against the receiver 11 for fastening. That is, the legs 9 are sandwiched between the head 25 and the distal end 11b (distal-end face 15a) of the receiver 11 for fastening.

As illustrated in FIGS. 8 and 9, the receiver 11 is surface-mounted on the mounting face 1a of the circuit board 1 by soldering, with the proximal end 11a (specifically, the attachment face 13a of the base 13) facing the mounting face 1a of the circuit board 1. The attachment face 13a is opposed to the mounting face 1a.

In one example, the solder 30 adheres to the entire circumference of the outer peripheral surface 13c of the base 13 in the entire thickness range. The solder 30 adheres to an annular area on the mounting face 1a that is around the outer peripheral surface of the base 13 and surrounds the base 13. The solder 30, which adheres to the receiver 11 and the mounting face 1a, firmly fixes the receiver 11 to the mounting face 1a. Preferably, a part of the solder 30 intervenes between the attachment face 13a and the mounting face 1a.

The receiver 11 is fixed to the mounting face 1a in this way. The fastener 12 screwed for fastening to the receiver 11 therefore means that the fastening mechanism 3 fixes the legs 9 of the heat receiver 5 to the circuit board 1.

According to the electronic device 100 of the present embodiment, the receiver 11 is surface-mounted on the mounting face 1a of the circuit board 1, and there is no need to form a hole in the circuit board 1 for placing the receiver 11. The electronic device therefore has less restriction in the position of the wiring (wiring formed on the circuit board 1) connected to the electronic components (e.g., CPU 4). This increases the degree of freedom in the design of wiring, and makes the circuit board 1 compact. The electronic device 100 therefore can be compact.

Referring to FIGS. 10 to 13, the following describes high degree of freedom in designing of the wiring on the circuit board 1 in the electronic device 100.

Figure 10:
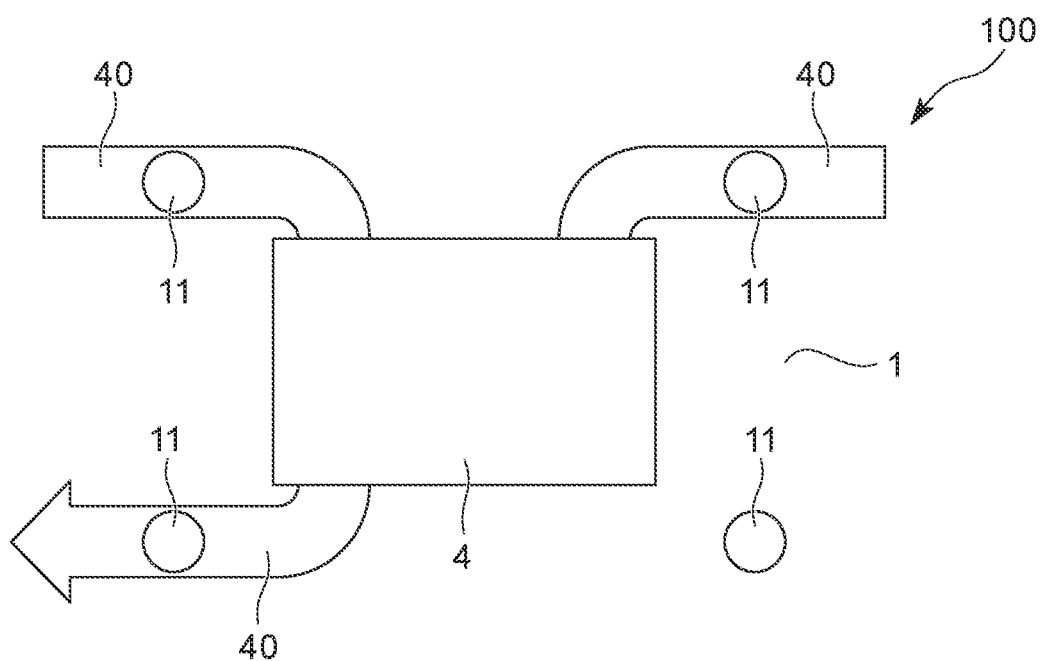
FIG. 10 is a plan view schematically illustrating an example of the wiring geometry in one embodiment.

As illustrated in FIG. 10, wiring 40 in the electronic device 100 of the embodiment is connected to the CPU 4 and is formed in the circuit board 1.

Figure 11:
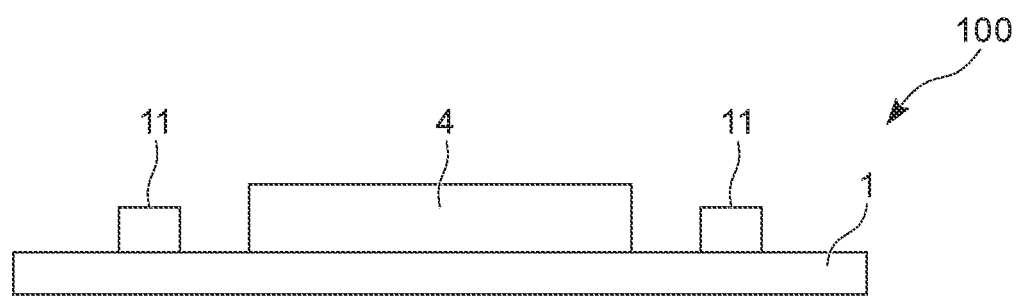
FIG. 11 is a side view schematically illustrating the structure of a circuit board in one embodiment.

As illustrated in FIG. 11, the receiver 11 of the electronic device 100 11 is surface-mounted on the circuit board 1. With this configuration, the electronic device 100 has less restriction in the position of the wiring 40 as illustrated in FIG. 10. In one example, the wiring 40 can be formed at a position overlapping with the receiver 11 in a plan view. In this way it has a high degree of freedom in the design of the wiring 40 formed on the circuit board 1.

Figure 12:
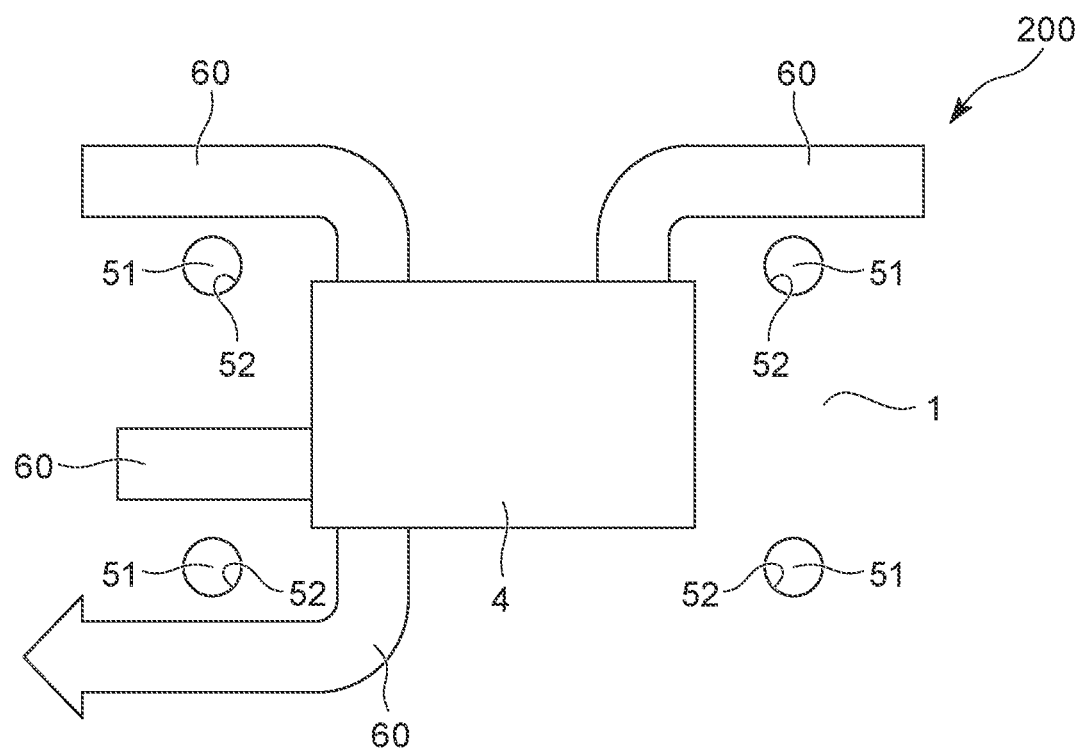
FIG. 12 is a plan view schematically illustrating an example of the wiring geometry in one comparative embodiment.
Figure 13:
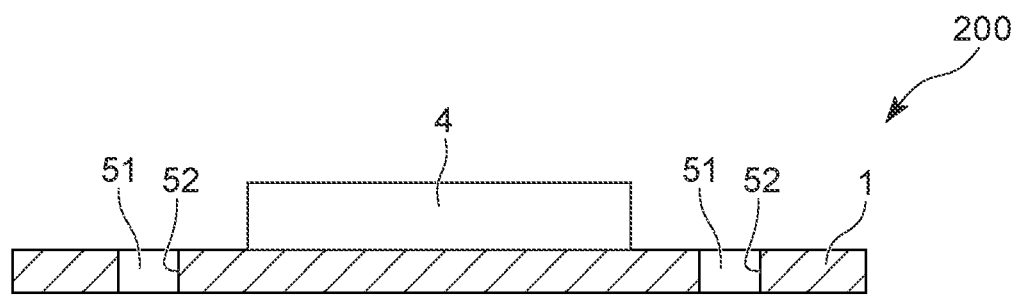
FIG. 13 is a cross-sectional view schematically illustrating the structure of a circuit board in one comparative embodiment.

FIG. 13 illustrates an electronic device 200 that is a comparative embodiment, in which a receiver 51 is placed in a through hole 52 formed in the circuit board 1. In this configuration, wiring 60 has to be formed avoiding the through hole 52 as illustrated in FIG. 12. This restricts the position of the wiring 60, which can be disadvantageous in terms of design flexibility.

As illustrated in FIG. 5, the electronic device 100 is configured so that the mounting hole 17 penetrates the receiver 11. This keeps a sufficient length of the mounting hole 17, and thus increases the screwing strength of the fastener 12. This lowers the height of the receiver 11 (dimension in the axial direction), i.e., enables a low-profile receiver 11. This is advantageous in making the electronic device 100 smaller and thinner.

As illustrated in FIGS. 6 and 7, the base 13 of the electronic device 100 has the outer peripheral surface 13c, on which the knurls 16 (unevenness) are formed, which increases the amount of solder 30 adhering to the base 13. This enhances the strength of the solder 30 to firmly fix the receiver 11 to the circuit board 1. Further the surface area of the outer peripheral surface 13c in the electronic device 100 increases due to the knurls 16. This increases the contact area between the outer peripheral surface 13c and the solder 30, and thus enhances the bonding strength between the receiver 11 and the solder 30. This firmly fixes the receiver 11 to the circuit board 1.

The specific configuration of the present invention is not limited to the above-described embodiments, and also includes designs within the scope of the present invention. The configurations described in the above embodiments may be combined freely.

As illustrated in FIGS. 6 and 7, the unevenness (knurls 16) on the receiver 11 includes the protruding portions 16a extending in the axial direction, and the shape of the unevenness is not particularly limited. For example, the unevenness on the outer peripheral surface of the receiver may include a plurality of dot-shaped protruding portions. When the unevenness on the receiver includes linear protruding ridges or grooves, the direction of the protruding ridges or grooves is not limited to the axial direction, and may be a direction inclined from the axial direction.

The receiver 11 illustrated in FIG. 7 has both the outer peripheral metal layer 21 and the inner peripheral metal layer 22. The receiver 11 may have only one of the outer peripheral metal layer 21 and the inner peripheral metal layer 22.

In another embodiment, the receiver may have neither an outer peripheral metal layer nor an inner peripheral metal layer. In another embodiment, the receiver may not have the unevenness (knurls).

As illustrated in FIG. 5, the receiver 11 and the fastener 12 are screwed for fastening. The fastening structure between the receiver and the fastener is not limited to the screwing. Other example of the fastening structure between the receiver and the fastener include a concave-convex engagement and a swaging structure.

Instead of the laptop PC, the electronic device may be of other types, such as a tablet terminal, a smartphone, and a desktop PC. The receiver may be called a fixture, a fastening tool, a coupling tool, a fastened tool, etc.

The invention claimed is:

1. An electronic device comprising:
   a circuit board having a mounting face, on which an electronic component is mounted;
   a heat receiver including a heat receiving plate opposed to the electronic component; and
   a fastening mechanism that fixes the heat receiver to the circuit board,
   the fastening mechanism including:
      a receiver having a proximal end and a distal end, the receiver having a mounting hole extending from the proximal end to the distal end; and
      a fastener that is inserted into the mounting hole for fastening to the receiver and for pressing the heat receiver,
      the receiver being surface-mounted on the mounting face by soldering, with the proximal end facing the mounting face,
      wherein the receiver includes only one outer peripheral metal layer added on an outer peripheral surface of the receiver that is at the proximal end, the only one outer peripheral metal layer having a surface with higher solder wettability than a surface of the receiver.

2. The electronic device according to claim 1, wherein the mounting hole has an internal thread therein, and to which the fastener is screwed, and
   the internal thread extends over an entire length of the mounting hole.

3. The electronic device according to claim 1, wherein the outer peripheral surface has unevenness at least at a part close to the proximal end.

4. The electronic device according to claim 1, wherein the receiver includes an inner peripheral metal layer added on an inner peripheral surface of the mounting hole that is at the proximal end, the inner peripheral metal layer having a surface with lower solder wettability than a surface of the receiver.

5. An electronic device comprising:
   a circuit board having a mounting face, on which an electronic component is mounted;
   a heat receiver including a heat receiving plate opposed to the electronic component; and
   a fastening mechanism that fixes the heat receiver to the circuit board,
   the fastening mechanism including:
      a receiver having a proximal end and a distal end, the receiver having a mounting hole extending from the proximal end to the distal end; and
      a fastener that is inserted into the mounting hole for fastening to the receiver and for pressing the heat receiver,
      the receiver being surface-mounted on the mounting face by soldering, with the proximal end facing the mounting face,
      wherein the receiver includes only one inner peripheral metal layer added on an inner peripheral surface of the mounting hole that is at the proximal end, the only one inner peripheral metal layer having a surface with lower solder wettability than a surface of the receiver.

* * * * *